(12) United States Patent
Han et al.

(10) Patent No.: US 12,538,696 B2
(45) Date of Patent: Jan. 27, 2026

(54) DISPLAY APPARATUS AND METHOD OF MANUFACTURING THE SAME

(71) Applicant: Samsung Display Co., Ltd., Yongin-si (KR)

(72) Inventors: Jongseok Han, Yongin-si (KR); Illsoo Park, Yongin-si (KR); Jaehong Kim, Yongin-si (KR); Hyomin Kim, Yongin-si (KR); Sijin Sung, Yongin-si (KR); Heeseong Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1045 days.

(21) Appl. No.: 17/518,551

(22) Filed: Nov. 3, 2021

(65) Prior Publication Data

US 2022/0190273 A1    Jun. 16, 2022

(30) Foreign Application Priority Data

Dec. 14, 2020   (KR) .................. 10-2020-0174725

(51) Int. Cl.
| | |
|---|---|
| *H10K 71/16* | (2023.01) |
| *H10K 50/11* | (2023.01) |
| *H10K 50/15* | (2023.01) |
| *H10K 101/40* | (2023.01) |

(52) U.S. Cl.
CPC .......... *H10K 71/164* (2023.02); *H10K 50/11* (2023.02); *H10K 50/15* (2023.02); *H10K 2101/40* (2023.02)

(58) Field of Classification Search
None
See application file for complete search history.

(56) References Cited

U.S. PATENT DOCUMENTS

| | | | |
|---|---|---|---|
| 7,342,355 | B2 | 3/2008 | Seo et al. |
| 7,572,522 | B2 | 8/2009 | Seo et al. |
| 8,616,930 | B1 | 12/2013 | Im et al. |
| 8,709,837 | B2 | 4/2014 | Im et al. |
| 9,172,044 | B2 | 10/2015 | Seo et al. |

(Continued)

FOREIGN PATENT DOCUMENTS

| | | | |
|---|---|---|---|
| CN | 111697156 A | * 9/2020 | ............ G02B 5/008 |
| KR | 2007-0112547 A | 11/2007 | |

(Continued)

OTHER PUBLICATIONS

Tsang, S.W., et al. "Application of admittance spectroscopy to evaluate carrier mobility in organic charge transport materials", Journal of Applied Physics, 2006, 8 pages, No. 99, American Institute of Physics.

*Primary Examiner* — Michael Lebentritt
(74) *Attorney, Agent, or Firm* — Womble Bond Dickinson (US) LLP

(57) ABSTRACT

A display apparatus includes a substrate, a first electrode on the substrate, a second electrode on the first electrode, an emission layer between the first electrode and the second electrode, and a hole transport layer located between the first electrode and the emission layer, and including a first mixed layer in which a first material and a second material different from the first material are mixed with each other, wherein an absolute value of a difference between a Highest Occupied Molecular Orbital (HOMO) energy level of the first material and a HOMO energy level of the second material is about 0.3 eV or less.

13 Claims, 16 Drawing Sheets

(56) References Cited

U.S. PATENT DOCUMENTS

| | | | |
|---|---|---|---|
| 9,224,966 B2 | 12/2015 | Sim et al. | |
| 9,224,969 B2 | 12/2015 | Song et al. | |
| 9,299,936 B2 | 3/2016 | Kho et al. | |
| 9,431,625 B2 | 8/2016 | Moon et al. | |
| 9,434,877 B2 | 9/2016 | Pflumm et al. | |
| 9,508,949 B2 | 11/2016 | Jeong et al. | |
| 9,806,276 B2 | 10/2017 | Kam et al. | |
| 10,186,679 B2 | 1/2019 | Song et al. | |
| 11,800,731 B2 | 10/2023 | Moon et al. | |
| 2007/0269916 A1 | 11/2007 | Kim et al. | |
| 2011/0175072 A1* | 7/2011 | Ooishi | H10K 50/11 |
| | | | 257/E51.027 |
| 2017/0025621 A1* | 1/2017 | Suzuki | C07D 209/86 |
| 2017/0309852 A1* | 10/2017 | Seo | H10K 50/818 |
| 2018/0026207 A1* | 1/2018 | Takeda | H10K 85/615 |
| | | | 548/444 |
| 2019/0207122 A1 | 7/2019 | Lim et al. | |

FOREIGN PATENT DOCUMENTS

| | | | |
|---|---|---|---|
| KR | 10-2008-0075480 A | 8/2008 | |
| KR | 10-2008-0112178 A | 12/2008 | |
| KR | 10-2013-0028813 A | 3/2013 | |
| KR | 10-2013-0038218 A | 4/2013 | |
| KR | 10-2013-0050713 A | 5/2013 | |
| KR | 10-2013-0062103 A | 6/2013 | |
| KR | 10-2013-0100634 A | 9/2013 | |
| KR | 10-2014-0011966 A | 1/2014 | |
| KR | 10-2017-0034067 A | 3/2017 | |
| KR | 10-2018-0003722 | 1/2018 | |
| KR | 10-1885245 | 9/2018 | |
| KR | 10-1942471 | 1/2019 | |
| KR | 10-2019-0081155 | 7/2019 | |
| KR | 10-2020-0022208 A | 3/2020 | |
| KR | 10-2087048 | 3/2020 | |
| KR | 10-2174351 B1 | 11/2020 | |
| WO | WO-2014014288 A1 * | 1/2014 | H01L 51/5008 |

* cited by examiner

DISPLAY APPARATUS AND METHOD OF MANUFACTURING THE SAME

CROSS-REFERENCE TO RELATED APPLICATIONS

This application claims priority from and the benefit of Korean Patent Application No. 10-2020-0174725, filed on Dec. 14, 2020, which is hereby incorporated by reference for all purposes as if fully set forth herein.

BACKGROUND

Field

Embodiments of the invention relate generally to a display apparatus and a method of manufacturing the display apparatus, and more particularly, to a display apparatus that may be manufactured with reduced manufacturing costs while maintaining the characteristics thereof, and a method of manufacturing the display apparatus.

Description of the Background

An organic light-emitting diode is a self-emission-type element that has advantages of a wide viewing angle, excellent contrast, a fast response time, and excellent luminance, driving voltage, and response speed characteristics, and is capable of multicolorization.

A typical organic light-emitting diode may have a structure in which an anode is formed on a substrate, and a hole transport layer, an emission layer, an electron transport layer, and a cathode are sequentially formed on the anode.

A driving principle of the organic light-emitting diode is presented below. When a voltage is applied between the anode and the cathode, holes injected from the anode move to the emission layer via the hole transport layer, and electrons injected from the cathode move to the emission layer via the electron transport layer. Carriers such as the aforementioned holes and electrons recombine with each other in the emission layer area and generate excitons. Light is generated as the excitons change from an excited state to a ground state.

The above information disclosed in this Background section is only for understanding of the background of the inventive concepts, and, therefore, it may contain information that does not constitute prior art.

SUMMARY

According to the inventive concepts, the manufacturing cost of a display apparatus may be reduced by changing a structure and material of a hole transport layer of the display apparatus. However, this objective is just an example and does not limit the scope of the inventive concepts.

Additional features of the inventive concepts will be set forth in the description which follows, and in part will be apparent from the description, or may be learned by practice of the inventive concepts.

According to an embodiment, a display apparatus includes a substrate, a first electrode on the substrate, a second electrode on the first electrode, an emission layer between the first electrode and the second electrode, and a hole transport layer located between the first electrode and the emission layer, and comprising a first mixed layer in which a first material and a second material different from the first material are mixed with each other, wherein an absolute value of a difference between a Highest Occupied Molecular Orbital (HOMO) energy level of the first material and a HOMO energy level of the second material is about 0.3 eV or less.

A Density of States (DOS) of the first material and a DOS of the second material may at least partially overlap each other.

A sum of a standard deviation of the DOS of the first material and a standard deviation of the DOS of the second material may be about 0.3 eV or more.

The hole transport layer may further include a first hole transport layer located between the first electrode and the first mixed layer and including the first material, and a second hole transport layer located between the first mixed layer and the second electrode and including the first material.

The first mixed layer may include a first portion and a second portion, wherein an amount of the first material in the first portion gradually decreases from a lower portion of the first portion to an upper portion of the first portion, and an amount of the first material in the second portion gradually increases from a lower portion of the second portion to an upper portion of the second portion.

The first portion and the first hole transport layer may contact each other, and the second portion and the second hole transport layer may contact each other.

The hole transport layer may further include a third hole transport layer located between a first mixed layer and the second hole transport layer and including the second material, and a second mixed layer between the third hole transport layer and the second hole transport layer, wherein, in the second mixed layer, the first material and the second material are mixed with each other.

An amount of the first material in the first mixed layer may gradually decrease from a lower portion of the first mixed layer to an upper portion of the first mixed layer.

The first hole transport layer and the first mixed layer may contact each other, and the first mixed layer and the third hole transport layer may contact each other.

An amount of the first material in the second mixed layer may gradually increase from a lower portion of the second mixed layer to an upper portion of the second mixed layer.

The second hole transport layer and the second mixed layer may contact each other, and the second mixed layer and the third hole transport layer may contact each other.

The hole transport layer further may include a second mixed layer between the first mixed layer and the second electrode, and a first hole transport layer located between the second mixed layer and the second electrode and including the second material.

An amount of the first material in the first mixed layer may gradually decrease from a lower portion of the first mixed layer to an upper portion of the first mixed layer.

An amount of the first material in the second mixed layer may gradually increase from a lower portion of the second mixed layer to an upper portion of the second mixed layer.

The first mixed layer and the first hole transport layer may contact each other, and the first hole transport layer and the second mixed layer may contact each other.

According to an embodiment, a method of manufacturing a display apparatus includes forming a first electrode on a substrate, spraying a first material on the first electrode by using a first depositing source that reciprocates in a first direction, and spraying a second material on the first electrode by using a second depositing source that reciprocates in the first direction, wherein an absolute value of a difference between a Highest Occupied Molecular Orbital (HOMO) energy level of the first material and a HOMO energy level of the second material is about 0.3 eV or less.

A Density of States (DOS) of the first material and a DOS of the second material may at least partially overlap each other.

A sum of a standard deviation of the DOS of the first material and a standard deviation of the DOS of the second material may be about 0.3 eV or more.

The spraying of the first material on the first electrode by using the first depositing source and the spraying of the second material on the first electrode by using the second depositing source may include forming a hole transport layer comprising a first hole transport layer including the first material, a first mixed layer in which the first material and the second material are mixed with each other, and a second hole transport layer including the first material.

The hole transport layer may further include a second mixed layer between the first mixed layer and the second hole transport layer, and a third hole transport layer between the first mixed layer and the second mixed layer.

Other aspects, features, and advantages other than those described above will become apparent from the accompanying drawings, the appended claims, and the detailed description of the disclosure.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
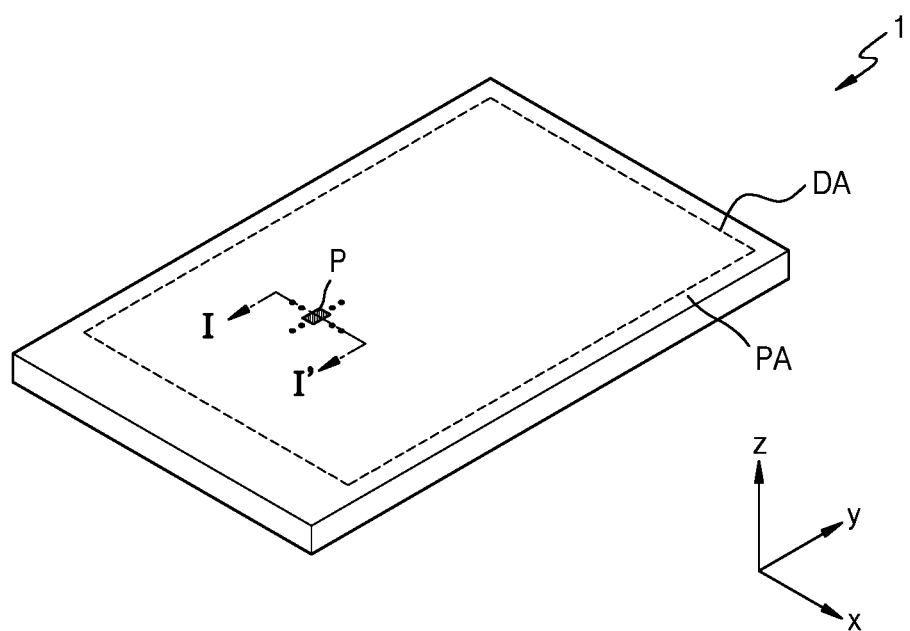
FIG. 1 is a perspective view schematically illustrating a display apparatus according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, one or more embodiments are described in detail with reference to the accompanying drawings, and in this case, like or corresponding constituent elements are assigned with like reference symbols.

FIG. 1 is a perspective view schematically illustrating a display apparatus 1 according to an embodiment.

Referring to FIG. 1, the display apparatus 1 may include a display area DA and a peripheral area PA around the display area DA. The peripheral area PA may at least partially surround the display area DA. The display apparatus 1 may provide an image by using light emitted from pixels P arranged in the display area DA, and the peripheral area PA may be a non-display area where no image is displayed.

In the following description, an organic light-emitting display apparatus is described as an example of the display apparatus 1 according to an embodiment, but the display apparatus of the present disclosure is not limited thereto. In an embodiment, the display apparatus 1 may include a display apparatus such as an inorganic light-emitting display (or inorganic electroluminescent (EL) display) or a quantum dot light-emitting display. For example, an emission layer of a display element of the display apparatus 1 may include an organic material, an inorganic material, quantum dots, an organic material with quantum dots, or an inorganic material with quantum dots.

Although FIG. 1 illustrates the display apparatus 1 having a flat display surface, the present disclosure is not limited thereto. In an embodiment, the display apparatus 1 may include a three-dimensional display surface or a curved display surface.

When the display apparatus 1 includes a three-dimensional display surface, the display apparatus 1 may include a plurality of display areas indicating different directions, for example, a polygonal-column-type display surface. In an embodiment, when the display apparatus 1 includes a curved display surface, the display apparatus 1 may be embodied in various forms such as flexible display apparatuses, foldable display apparatuses, and rollable display apparatuses.

FIG. 1 illustrates the display apparatus 1 that may be applicable to a mobile phone terminal. Although not illustrated, an electronic module, a camera module, a power module, etc., which are mounted on a main board, may be arranged in a bracket, a case, or the like, along with the display apparatus 1 to thereby configure a mobile phone terminal. For example, the display apparatus 1 may be applied to small and medium-sized electronic devices such as tablet PCs, car navigation devices, game machines, smart watches, or the like, as well as large-sized electronic devices such as televisions and monitors.

In FIG. 1, the display area DA of the display apparatus 1 is rectangular, but the shape of the display area DA may be a circle, an oval, or a polygon such as a triangle, a pentagon, and the like.

The display apparatus 1 may include pixels P in the display area DA. Each of the pixels P may include an organic light-emitting diode (OLED). For example, each of the pixels P may emit one of red light, green light, blue light, and white light through the organic light-emitting diode (OLED). As described above, the "pixel P" as used herein may be understood as a pixel that emits one of red light, green light, blue light, and white light.

Figure 2:
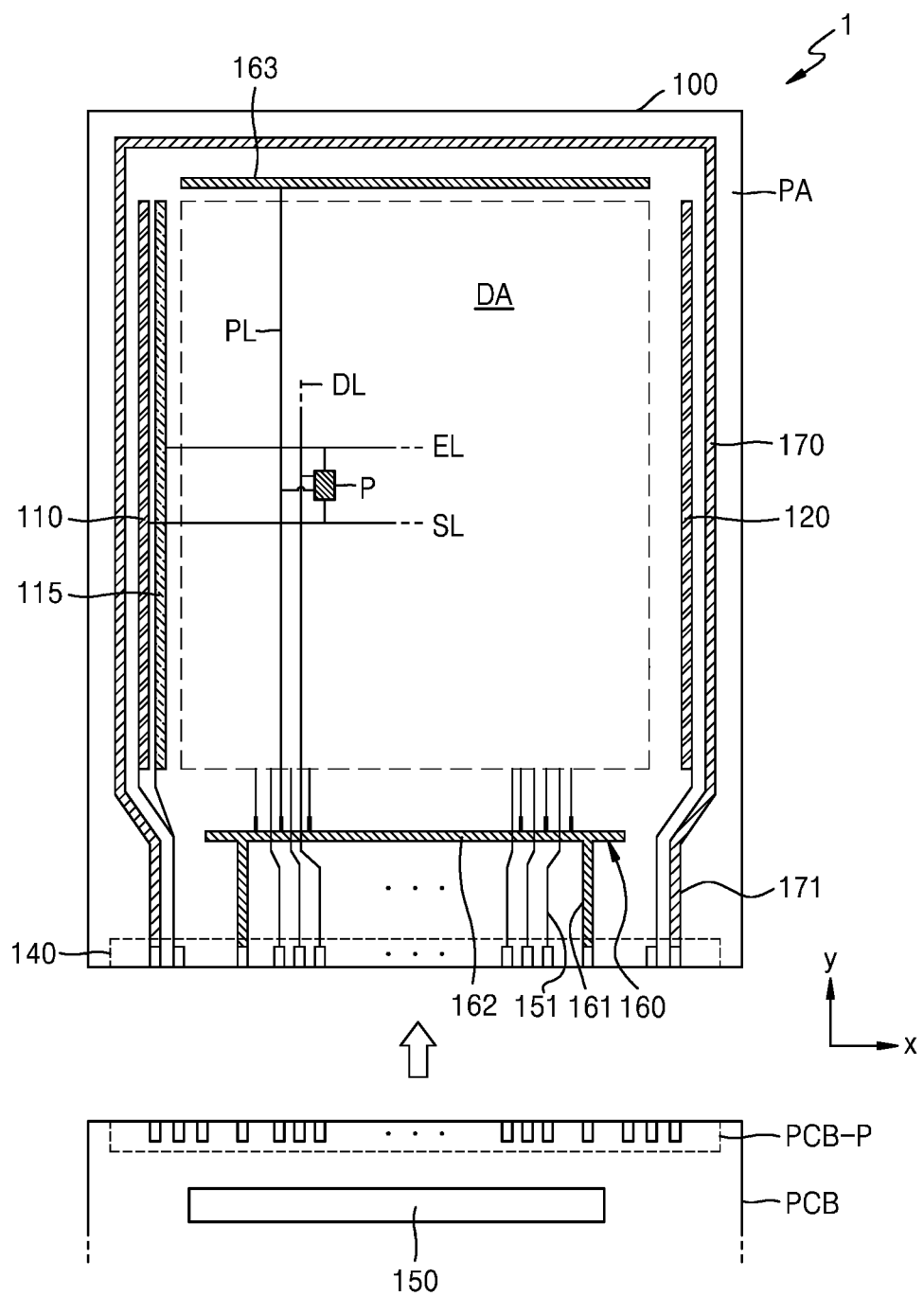
FIG. 2 is a plan view schematically illustrating a display apparatus according to an embodiment.

FIG. 2 is a plan view schematically illustrating a display apparatus 1 according to an embodiment.

Referring to FIG. 2, the display apparatus 1 may include pixels P in a display area DA. Each of the pixels P may be electrically connected to external circuits arranged in a peripheral area PA. A first scan driving circuit 110, a first emission driving circuit 115, a second scan driving circuit 120, a terminal 140, a data driving circuit 150, a first power supply line 160, and a second power supply line 170 may be arranged in the peripheral area PA.

The first scan driving circuit 110 may provide a scan signal to each pixel P via a scan line SL. The first emission driving circuit 115 may provide an emission control signal to each pixel P via an emission control line EL. The second scan driving circuit 120 may be arranged in parallel with the first scan driving circuit 110 with the display area DA therebetween. In an embodiment, some of the pixels P arranged in the display area DA may be electrically connected to the first scan driving circuit 110, and the other ones may be electrically connected to the second scan driving circuit 120. In an embodiment, the second scan driving circuit 120 may be omitted.

In the peripheral area PA, the first emission driving circuit 115 and the first scan driving circuit 110 may be spaced apart from each other in an x direction. In addition, the first emission driving circuit 115 and the first scan driving circuit 110 may be alternately arranged in a y direction.

The terminal 140 may be arranged at one side of a substrate 100. The terminal 140 may be exposed by not being covered by an insulating layer, and electrically connected to a printed circuit board PCB. A terminal PCB-P of the printed circuit board PCB may be electrically connected to the terminal 140 of the display apparatus 1. The printed circuit board PCB may be configured to transmit signals or power of a controller (not illustrated) to the display apparatus 1. Control signals generated by the controller may be transmitted to the first scan driving circuit 110, the first emission driving circuit 115, and the second scan driving circuit 120 through the printed circuit board PCB. The controller may provide a first power supply voltage ELVDD (see FIG. 3) and a second power supply voltage ELVSS (see FIG. 3) to the first power supply line 160 and the second power supply line 170, respectively, through a first connection line 161 and a second connection line 171. The first power voltage ELVDD may be provided to each pixel P through a driving voltage line PL connected to the first power supply line 160, and the second power voltage ELVSS may be provided to a second electrode of each pixel P connected to the second power supply line 170.

The data driving circuit 150 may be electrically connected to a data line DL. Data signals of the data driving circuit 150 may be provided to each pixel P through a connection line 151 connected to the terminal 140 and the data line DL connected to the connection line 151.

In FIG. 2, the data driving circuit 150 is arranged on the printed circuit board PCB, but in an embodiment, the data driving circuit 150 may be arranged on the substrate 100. For example, the data driving circuit 150 may be arranged between the terminal 140 and the first power supply line 160.

The first power supply line 160 may include a first sub-line 162 and a second sub-line 163 that extend in parallel with each other in the x direction with the display area DA therebetween. The second power supply line 170 may partially surround the display area DA in a loop shape with one side open.

Figure 3:
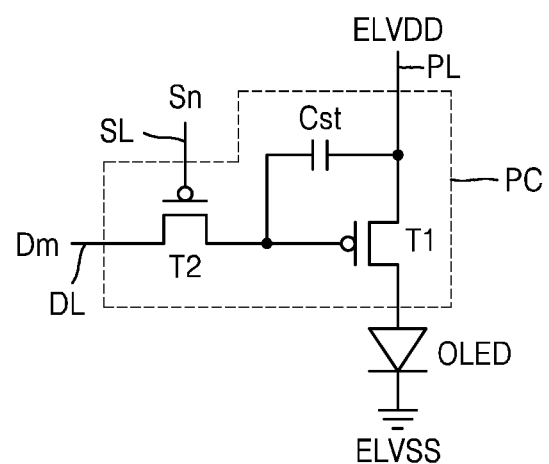
FIGS. 3 and 4 are equivalent circuit diagrams illustrating a pixel that may be included in a display apparatus, according to an embodiment.
Figure 4:
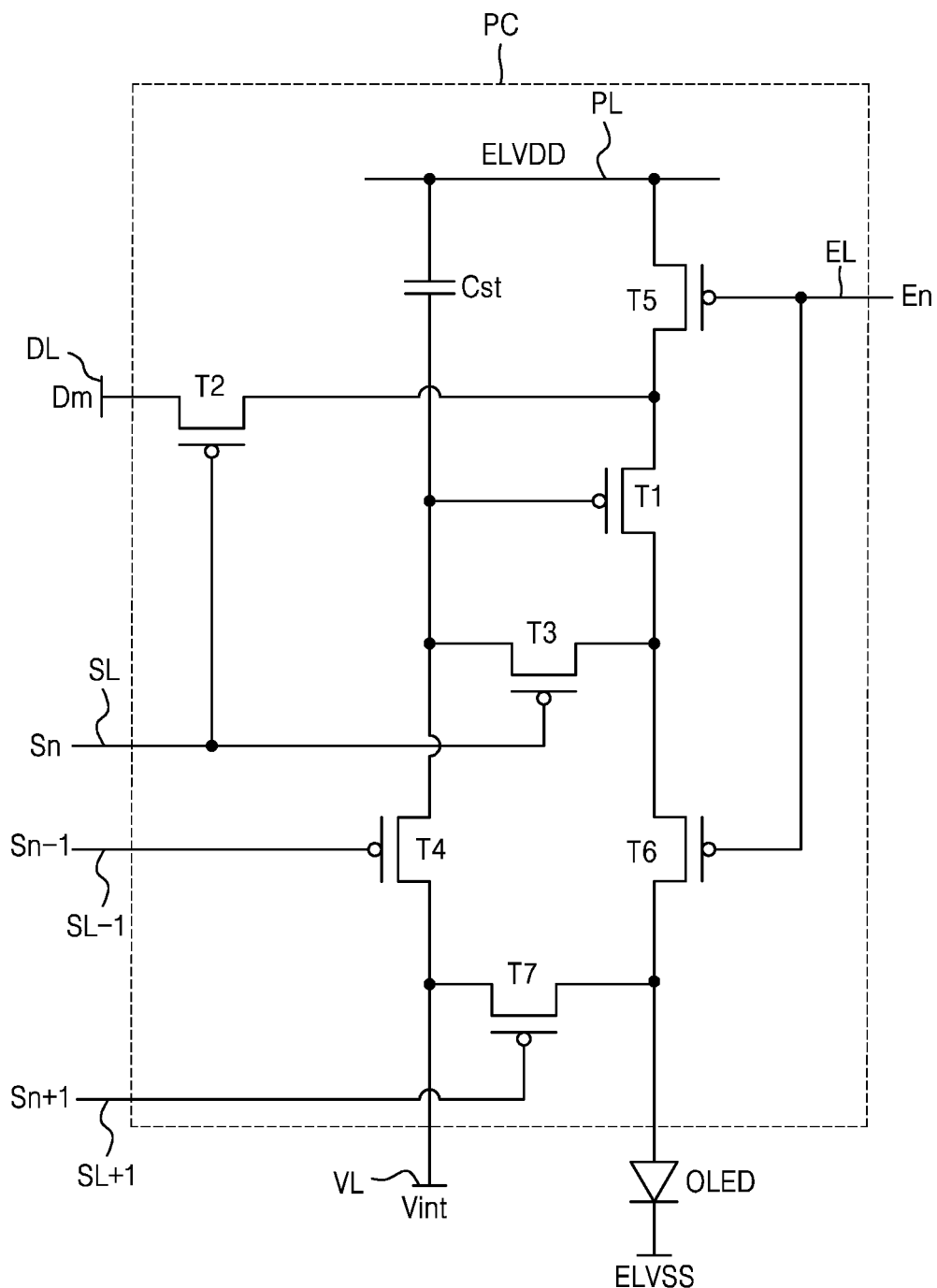

FIGS. 3 and 4 are equivalent circuit diagrams illustrating a pixel that may be included in a display apparatus, according to an embodiment.

Referring to FIG. 3, a pixel circuit PC may be connected to an organic light-emitting diode OLED to implement emission of pixels. The pixel circuit PC may include a driving thin-film transistor T1, a switching thin-film transistor T2, and a storage capacitor Cst. The switching thin-film transistor T2 is connected to a scan line SL and a data line DL and may transmit, according to a scan signal Sn received via the scan line SL, a data signal Dm received via the data line DL to the driving thin-film transistor T1.

The storage capacitor Cst is connected to the switching thin-film transistor T2 and a driving voltage line PL and may store a voltage corresponding to a voltage difference between the voltage received from the switching thin-film transistor T2 and a first power voltage ELVDD applied to the driving voltage line PL.

The driving thin-film transistor T1 is connected to the driving voltage line PL and the storage capacitor Cst and may control a driving current flowing from the driving voltage line PL to the organic light-emitting diode OLED corresponding to a voltage stored in the storage capacitor Cst. The organic light-emitting diode OLED may emit light having a luminance according to the driving current.

In FIG. 3, the pixel circuit PC includes two thin-film transistors and one storage capacitor, but the present disclosure is not limited thereto.

Referring to FIG. 4, a pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, a second initialization thin-film transistor T7, and a storage capacitor Cst.

In FIG. 4, a scan line SL, a previous scan line SL−1, a next scan line SL+1, an emission control line EL, and a data line DL (hereinafter collectively referred to as signal lines), an initialization voltage line VL, and a driving voltage line PL are provided for each pixel circuit PC, but the present disclosure is not limited thereto. In an embodiment, at least one of the signal lines SL, SL−1, SL+1, EL, and DL, and/or the initialization voltage line VL may be shared by neighboring pixel circuits.

A drain electrode of the driving thin-film transistor T1 may be electrically connected to an organic light-emitting diode OLED via the emission control thin-film transistor T6. The driving thin-film transistor T1 may receive a data signal Dm according to a switching operation of the switching thin-film transistor T2, and supply a driving current to the organic light-emitting diode OLED.

A gate electrode of the switching thin-film transistor T2 may be connected to the scan line SL, and a source electrode of the switching thin-film transistor T2 may be connected to the data line DL. A drain electrode of the switching thin-film transistor T2 may be connected to the driving voltage line PL via the operation control thin-film transistor T5 while being connected to a source electrode of the driving thin-film transistor T1.

The switching thin-film transistor T2 is turned on according to a scan signal Sn received via the scan line SL and may perform a switching operation of transmitting the data signal Dm received via the data line DL to the source electrode of the driving thin-film transistor T1.

A gate electrode of the compensation thin-film transistor T3 may be connected to the scan line SL. A source electrode of the compensation thin-film transistor T3 may be connected to a first electrode of the organic light-emitting diode OLED via the emission control thin-film transistor T6 while being connected to the drain electrode of the driving thin-film transistor T1. A drain electrode of the compensation thin-film transistor T3 may be connected to all of any one electrode of the storage capacitor Cst, a source electrode of the first initialization thin-film transistor T4, and a gate electrode of the driving thin-film transistor T1. The compensation thin-film transistor T3 is turned on according to the scan signal Sn received via the scan line SL, and connects the gate and drain electrodes of the driving thin-film transistor T1 to each other so that the driving thin-film transistor T1 is diode-connected.

A gate electrode of the first initialization thin-film transistor T4 may be connected to the previous scan line SL−1. A drain electrode of the first initialization thin-film transistor T4 may be connected to the initialization voltage line VL. The source electrode of the first initialization thin-film transistor T4 may be connected to all of any one electrode of the storage capacitor Cst, the drain electrode of the compensation thin-film transistor T3, and the gate electrode of the driving thin-film transistor T1. The first initialization thin-film transistor T4 is turned on according to a previous scan signal Sn−1 received via the previous scan line SL−1, and may perform an initialization operation of initializing a voltage of the gate electrode of the driving thin-film transistor T1 by transmitting an initialization voltage Vint to the driving gate electrode of the driving thin-film transistor T1.

A gate electrode of the operation control thin-film transistor T5 may be connected to the emission control line EL. A source electrode of the operation control thin-film transistor T5 may be connected to the driving voltage line PL. A drain electrode of the operation control thin-film transistor T5 may be connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the first electrode of the organic light-emitting diode OLED. The operation control thin-film transistor T5 and the emission control thin-film transistor T6 are simultaneously turned on according to an emission control signal En received via the emission control line EL so that a first power voltage ELVDD is transmitted to the organic light-emitting diode OLED, and thus, a driving current flows through the organic light-emitting diode OLED.

A gate electrode of the second initialization thin-film transistor T7 may be connected to the next scan line SL+1. A source electrode of the second initialization thin-film transistor T7 may be connected to the first electrode of the organic light-emitting diode OLED. A drain electrode of the second initialization thin-film transistor T7 may be connected to the initialization voltage line VL. The second initialization thin-film transistor T7 is turned on according to a next scan signal Sn+1 received via the next scan line SL+1 and may initialize the first electrode of the organic light-emitting diode OLED.

In FIG. 4, the first initialization thin-film transistor T4 and the second initialization thin-film transistor T7 are connected to the previous scan line SL−1 and the next scan line SL+1, respectively, but the present disclosure is not limited thereto. In an embodiment, both of the first initialization thin-film transistor T4 and the second initialization thin-film transistor T7 may be connected to the previous scan line SL−1 so as to be driven according to the previous scan signal Sn−1.

The other electrode of the storage capacitor Cst may be connected to the driving voltage line PL. One electrode of the storage capacitor Cst may be connected to all of the gate electrode of the driving thin-film transistor T1, the drain electrode of the compensation thin-film transistor T3, and the source electrode of the first initialization thin-film transistor T4.

A second electrode (e.g., a cathode) of the organic light-emitting diode OLED may receive a second power voltage ELVSS. The organic light-emitting diode OLED may receive a driving current from the driving thin-film transistor T1 and emit light.

The pixel circuit PC is not limited to the number of thin-film transistors, the number of storage capacitors, and/or the circuit design described with reference to FIG. 4, and the number of thin-film transistors, the number of storage capacitors, and/or the circuit design may vary.

Figure 5:
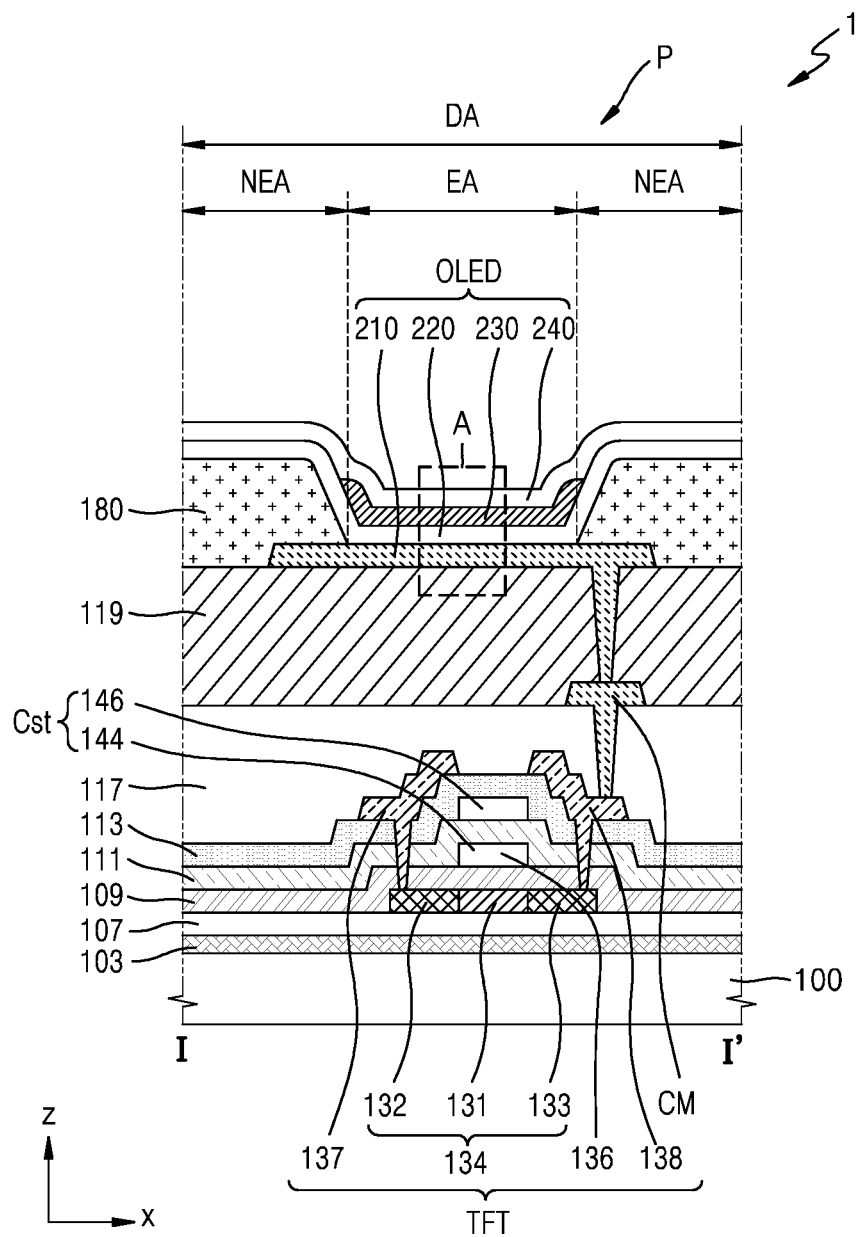
FIG. 5 is a cross-sectional view schematically illustrating a display apparatus according to an embodiment.

FIG. 5 is a cross-sectional view schematically illustrating a display apparatus 1 according to an embodiment.

Hereinbelow, a stacked structure of the display apparatus 1 will be briefly described with reference to FIG. 5.

Referring to FIG. 5, a thin-film transistor TFT and an organic light-emitting diode OLED may be arranged on a substrate 100.

The substrate 100 may include a glass material, a ceramic material, a metal material, or a material that is flexible or bendable. In an embodiment, the substrate 100 may include a polymer resin such as polyether sulfone, polyacrylate, polyetherimide, polyethylene naphthalate, polyethylene terephthalate, polyphenylene sulfide, polyarylate, polycarbonate, and/or cellulose acetate propionate.

A barrier layer 103 may be arranged on the substrate 100. The barrier layer 103 may be arranged on the substrate 100 to reduce or block penetration of foreign substances, moisture, or external air from below. In an embodiment, the barrier layer 103 may include an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), zinc oxide (ZnO), and/or the like. In an embodiment, the barrier layer 103 may be omitted.

A buffer layer 107 may be arranged above the substrate 100. The buffer layer 107 is located above the substrate 100 and may reduce or prevent penetration of foreign substances, moisture, or external air from the bottom of the substrate 100 and provide a flat surface on the substrate 100. The buffer layer 107 may include an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), zinc oxide (ZnO), and/or the like. In an embodiment, the buffer layer 107 may include one of silicon oxide ($SiO_X$) and silicon nitride ($SiN_X$). In some embodiments, the buffer layer 107 may have a multi-layer structure of silicon oxide ($SiO_X$) and silicon nitride ($SiN_X$).

The thin-film transistor TFT may be arranged on the buffer layer 107. The thin-film transistor TFT may include a semiconductor layer 134, a gate electrode 136 overlapping the semiconductor layer 134, and a connection electrode electrically connected to the semiconductor layer 134. The thin-film transistor TFT may be connected to an organic light-emitting diode OLED and drive the organic light-emitting diode OLED.

The semiconductor layer 134 is arranged on the buffer layer 107 and may include a channel area 131, a source area 132, and a drain area 133, wherein the channel area 131 overlaps the gate electrode 136, and the source area 132 and the drain area 133 are respectively at opposite sides of the channel area 131 and include impurities of a high concentration. Here, the impurities may include one of N-type impurities and P-type impurities. The source area 132 and the drain area 133 may be electrically connected to the connection electrode.

The semiconductor layer 134 may include oxide semiconductor and/or silicon semiconductor. In an embodiment, when the semiconductor layer 134 is formed of oxide semiconductor, the semiconductor layer 134 may include, for example, an oxide of at least one material selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). For example, the semiconductor layer 134 may include InSnZnO (ITZO), InGaZnO (IGZO), etc. In an embodiment, when the semiconductor layer 134 is formed of silicon semiconductor, the semiconductor layer 134 may include, for example, amorphous silicon (a-Si) or low-temperature polysilicon (LTPS) obtained by crystallizing the amorphous silicon (a-Si).

A first insulating layer 109 may be arranged on the semiconductor layer 134. The first insulating layer 109 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO). The first insulating layer 109 may be a single layer or a multi-layer including the above-described inorganic insulating material.

The gate electrode 136 may be arranged on the first insulating layer 109. The gate electrode 136 may include a single layer or a multi-layer including at least one metal selected from among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 136 may be connected to a gate line configured to apply an electrical signal to the gate electrode 136.

A second insulating layer 111 may be arranged on the gate electrode 136. The second insulating layer 111 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO). The second insulating layer 111 may be a single layer or a multi-layer including the above-described inorganic insulating material.

A storage capacitor Cst may be arranged above the first insulating layer 109. The storage capacitor Cst may include a lower electrode 144 and an upper electrode 146 overlapping the lower electrode 144. The lower and upper electrodes 144 and 146 of the storage capacitor Cst may overlap each other with the second insulating layer 111 therebetween.

In an embodiment, the lower electrode 144 of the storage capacitor Cst and the gate electrode 136 of the thin-film transistor TFT may overlap each other and may be provided as a single body. In an embodiment, the lower electrode 144 of the storage capacitor Cst may be spaced apart from the gate electrode 136 of the thin-film transistor TFT and arranged on the first insulating layer 109 as a separate and independent element.

The upper electrode 146 of the storage capacitor Cst may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu) and may include a single layer or a multi-layer including the above-mentioned materials.

A third insulating layer 113 may be arranged on the upper electrode 146 of the storage capacitor Cst. The third insulating layer 113 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO). The third insulating layer 113 may be a single layer or a multi-layer including the above-described inorganic insulating material.

A source electrode 137 and a drain electrode 138, which are connection electrodes, may be arranged on the third insulating layer 113. Each of the source electrode 137 and the drain electrode 138 may include a conductive material including molybdenum (Mo), aluminum (Al), copper (Cu), titanium (Ti), and/or the like, and may include a single layer or a multi-layer including the above-mentioned conductive material. Each of the source electrode 137 and the drain electrode 138 may have a multi-layer structure of a Ti layer, an Al layer, and another Ti layer.

A first planarization layer 117 may be arranged on the source electrode 137 and the drain electrode 138. In the first planarization layer 117, a film including an organic material or an inorganic material may be formed as a single layer or multiple layers. In an embodiment, the first planarization layer 117 may include a general-purpose polymer such as benzocyclobutene (BCB), polyimide (PI), hexamethyldisiloxane (HMDSO), poly(methyl methacrylate) (PMMA), or polystyrene (PS), polymer derivatives having a phenol-based group, an acryl-based polymer, an imide-based polymer, an aryl-ether-based polymer, an amide-based polymer, a fluorine-based polymer, a p-xylene-based polymer, a vinyl-alcohol-based polymer, and/or any blends thereof. Meanwhile, the first planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO). After the first planarization layer 117 is formed, chemical mechanical polishing may be performed thereon to provide a flat upper surface.

A contact metal layer CM may be arranged on the first planarization layer 117. The contact metal layer CM may include aluminum (Al), copper (Cu), and titanium (Ti), etc., and may be formed of a single layer or a multi-layer. The contact metal layer CM may have a multi-layer structure of a Ti layer, an Al layer, and another Ti layer.

A second planarization layer 119 may be arranged on the contact metal layer CM. In the second planarization layer 119, a film including an organic material or an inorganic material may be formed as a single layer or multiple layers. In an embodiment, the second planarization layer 119 and the first planarization layer 117 may include a same material. In an embodiment, the second planarization layer 119 and the first planarization layer 117 may include different materials from each other. After the second planarization layer 119 is formed, chemical mechanical polishing may be performed thereon to provide a flat upper surface. In an embodiment, the second planarization layer 119 may be omitted.

The organic light-emitting diode OLED including a first electrode 210, a hole transport layer 220, an emission layer 230, and a second electrode 240 may be arranged on the second planarization layer 119. The first electrode 210 may be electrically connected to the contact metal layer CM via a contact hole penetrating into the second planarization layer 119, and the contact metal layer CM may be electrically connected to one of the source electrode 137 and the drain electrode 138, which are connection electrodes of the thin-film transistor TFT, via a contact hole penetrating into the first planarization layer 117. Accordingly, the organic light-emitting diode OLED may be electrically connected to the thin-film transistor TFT.

The first electrode 210 may be arranged on the second planarization layer 119. The first electrode 210 may be a (semi-)light-transmitting electrode or a reflective electrode. The first electrode 210 may include a reflective layer and a transparent or translucent electrode layer formed on the reflective layer, wherein the reflective layer includes aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), copper (Cu), and/or any compounds thereof. The transparent or translucent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The first electrode 210 may have a stacked structure of an ITO layer, an Ag layer, and another ITO layer.

A pixel-defining layer 180 may be arranged on the second planarization layer 119, and the pixel-defining layer 180 may include an opening through which at least a portion of the first electrode 210 is exposed. An area exposed through the opening of the pixel-defining layer 180 may be defined as an emission area EA. An area around the emission area EA is a non-emission area NEA, and the non-emission area NEA may surround the emission area EA. In other words, a display area DA may include a plurality of emission areas EA and a plurality of non-emission areas NEA surrounding the emission areas EA. The pixel-defining layer 180 may increase a distance between the first electrode 210 and the second electrode 240 above the first electrode 210, thereby preventing an arc, etc. from occurring at an edge of the first electrode 210. For example, the pixel-defining layer 180 may include an organic insulating material such as PI, polyamide, an acryl-based resin, BCB, HMDSO, and a phenolic resin, and may be formed by spin coating, etc. In an embodiment, a spacer (not illustrated) may be further arranged on the pixel-defining layer 180.

The hole transport layer 220 may be arranged on the first electrode 210 of which a portion is exposed by the pixel-defining layer 180. The emission layer 230 may be arranged on the hole transport layer 220, and the second electrode 240 may be arranged on the emission layer 230.

Figure 6:
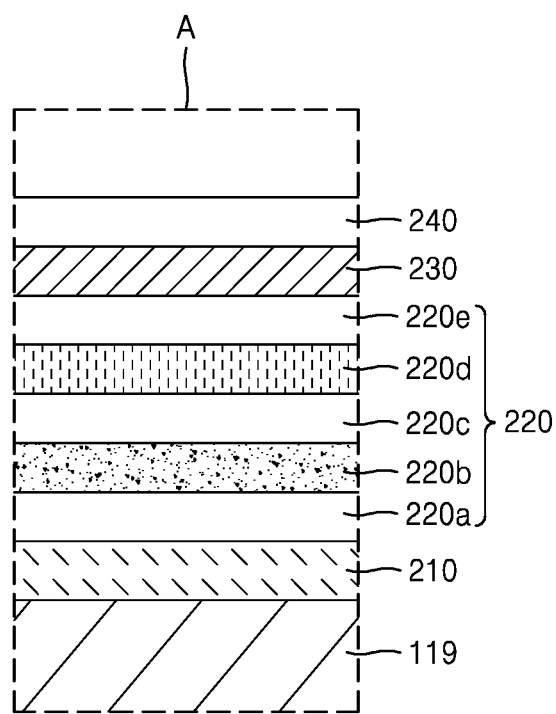
FIG. 6 is an enlarged view of region A in FIG. 5, according to an embodiment.

FIG. 6 is an enlarged view of region A in FIG. 5, according to an embodiment.

Referring to FIGS. 5 and 6, the hole transport layer 220 may include a first hole transport layer 220*a*, a first mixed layer 220*b*, and a second hole transport layer 220*e*. In addition, the hole transport layer 220 may further include a third hole transport layer 220*c* and a second mixed layer 220*d*, wherein the third hole transport layer 220*c* is located between the first mixed layer 220*b* and the second hole transport layer 220*e*, and the second mixed layer 220*d* is arranged between the third hole transport layer 220*c* and the second hole transport layer 220*e*.

In an embodiment, each of the first hole transport layer 220*a* and the second hole transport layer 220*e* may include a first material, and the third hole transport layer 220*c* may include a second material different from the first material. In addition, each of the first mixed layer 220*b* and the second mixed layer 220*d* may include the first material and the second material. For example, each of the first mixed layer 220*b* and the second mixed layer 220*d* may be a layer in which the first material and the second material are mixed. In some embodiments, each of the first mixed layer 220*b* and the second mixed layer 220*d* may be a layer in which the first material and the second material are alternately arranged. In this case, the second material may be cheaper than the first material.

Figure 7:
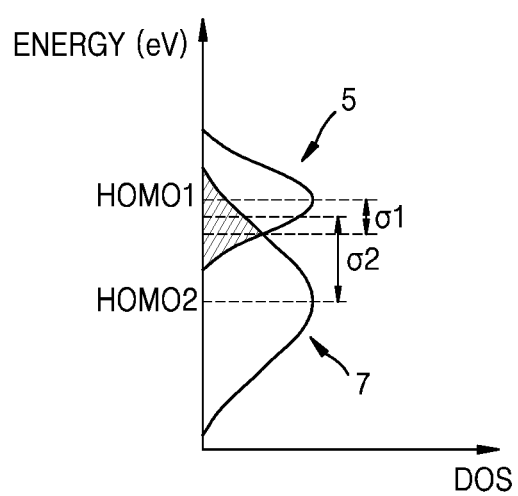
FIG. 7 is a graph illustrating a Density Of States (DOS) of each of a first material and a second material according to an embodiment.

FIG. 7 is a graph illustrating a Density Of States (DOS) of a first material and a DOS of a second material according to an embodiment.

Each of the first and second materials has its intrinsic DOS, and when a DOS 5 of the first material and a DOS 7 of the second material are so narrow that they do not overlap each other, the transport of charges (e.g., holes) may not be performed smoothly, and thus, the characteristics of the organic light-emitting diode OLED may be deteriorated. For example, the emission efficiency of the organic light-emitting diode OLED may be deteriorated.

In addition, when a difference between a Highest Occupied Molecular Orbital (HOMO) energy level of the first material and a HOMO energy level of the second material is large, the transport of charges (e.g., holes) is not smoothly performed, and thus, the characteristics of the organic light-emitting diode OLED may also be deteriorated. For example, the emission efficiency of the organic light-emitting diode OLED may be deteriorated.

Referring to FIG. 7, in an embodiment, the DOS 5 of the first material and the DOS 7 of the second material may at least partially overlap each other. When the DOS 5 of the first material and the DOS 7 of the second material overlap each other at least in part, the transport of charges (e.g., holes) may be performed smoothly.

In an embodiment, an absolute value of the difference between the HOMO energy level of the first material and the HOMO energy level of the second material may be 0.3 eV or less.

For example, when the HOMO energy level of the first material is referred to as HOMO1 and the HOMO energy level of the second material is referred to as HOMO2, the absolute value of the difference between HOMO1 and HOMO2 may be 0.3 eV or less. When the absolute value of the difference between HOMO1 and HOMO2 exceeds 0.3 eV, the area where the DOS 5 of the first material and the DOS 7 of the second material overlap each other is reduced or does not exist, and thus, the transport of charges (e.g., holes) may decrease. The decrease in charge (e.g., hole) transport causes a decrease in conductivity, and thus, the efficiency of the organic light-emitting diode may be deteriorated. Therefore, when the absolute value of the difference between HOMO1 and HOMO2 is 0.3 eV or less, there is an area where the DOS 5 of the first material and the DOS 7 of the second material overlap each other, and thus, the transport of charges (e.g., holes) may be smoothly performed.

The DOS 5 of the first material has a Gaussian distribution, where the DOS 5 of the first material has a gentle-slope bell shape as a value of a standard deviation σ increases, and the DOS 5 of the first material has a shape that is thin and sharp as the value of the standard deviation σ decreases. The same is true for the DOS 7 of the second material.

In an embodiment, the sum of the standard deviation σ of the DOS 5 of the first material and the standard deviation σ of the DOS 7 of the second material may be 0.3 eV or more. For example, when the standard deviation σ of the DOS 5 of the first material is a first standard σ1, and the standard deviation σ of the DOS 7 of the second material is a second standard deviation σ2, the sum of the first standard deviation σ1 and the second standard deviation σ2 may be 0.3 eV or more.

When the DOS 5 of the first material and the DOS 7 of the second material at least partially overlap each other, and the overlapped area is present outside the first standard deviation σ1 and the second standard deviation σ2 (for example, when an area where the DOS 5 of the first material and the DOS 7 of the second material overlap each other is present outside the first standard deviation σ1 and the second standard deviation σ2), the area where the DOS 5 of the first material and the DOS 7 of the second material overlap each other is reduced, and thus, the transport of charges (e.g., holes) may decrease. Thus, when the sum of the first standard deviation σ1 and the second standard deviation σ2 is less than 0.3 eV, the area where the DOS 5 of the first material and the DOS 7 of the second material overlap each other is reduced, or there is no area where the DOS 5 of the first material and the DOS 7 of the second material overlap each other, and thus, the transport of charges (e.g., holes) is reduced, and the emission efficiency of the organic light-emitting diode OLED may be deteriorated.

When the sum of the first standard deviation σ1 and the second standard deviation σ2 is 0.3 eV or more, the area where the DOS 5 of the first material and the DOS 7 of the second material overlap each other increases, and thus, the transport of charges (e.g., holes) may be performed smoothly.

In an embodiment, when the absolute value of the difference between HOMO1 and HOMO2 is 0.3 eV or less, and the sum of the first standard deviation σ1 and the second standard deviation σ2 is 0.3 eV or more, and thus, the area where the DOS 5 of the first material and the DOS 7 of the second material overlap each other may increase, and thus, the transport of charges (e.g., holes) may be performed smoothly.

Referring back to FIG. 6, in an embodiment, the first hole transport layer 220a and the first mixed layer 220b may contact each other, and the first mixed layer 220b and the third hole transport layer 220c may directly contact each other. For example, the first mixed layer 220b including the first material and the second material may be directly arranged on the first hole transport layer 220a including the first material, and the third hole transport layer 220c including the second material may be directly arranged on the first mixed layer 220b.

In an embodiment, the first mixed layer 220b may include the first material and the second material, and an amount of the first material in the first mixed layer 220b may gradually decrease from a lower portion of the first mixed layer 220b to an upper portion of the first mixed layer 220b. Thus a lower portion of the first mixed layer 220b may have a greater amount of the first material than an upper portion of the first mixed layer 220b.

A portion of the first mixed layer 220b that is closest to the first hole transport layer 220a may include the first material, and an amount of the first material may decrease and an amount of the second material may increase from the lower portion of the first mixed layer 220b to the upper portion of the first mixed layer 220b. In addition, a portion of the first mixed layer 220b that is closest to the third hole transport layer 220c may include the second material, and an amount of the first material may increase and an amount of the second material may decrease from the upper portion of the first mixed layer 220b to the lower portion of the first mixed layer 220b. In other words, the first mixed layer 220b includes the first material and the second material, and a content of the first material in the first mixed layer 220b may gradually decrease from the lower portion of the first mixed layer 220b to the upper portion of the first mixed layer 220b, and a content of the second material may gradually increase from the lower portion of the first mixed layer 220b to the upper portion to the first mixed layer 220b. In this case, the lower portion may refer to a portion adjacent to the first electrode 210 as compared to the upper portion.

In an embodiment, as the amount of the first material included in the first mixed layer 220b decreases from the lower portion to the upper portion, and the amount of the second material increases from the lower portion to the upper portion, the charges (e.g., holes) may easily transmitted from the first hole transport layer 220a including the first material to the third hole transport layer 220c including the second material.

In an embodiment, the third hole transport layer 220c and the second mixed layer 220d may contact each other, and the second mixed layer 220d and the second hole transport layer 220e may directly contact each other. For example, the second mixed layer 220d including the first material and the second material may be directly arranged on the third hole transport layer 220c including the second material, and the second hole transport layer 220e including the first material may be directly arranged on the second mixed layer 220d.

In an embodiment, the second mixed layer 220d may include the first material and the second material, and an amount of the first material in the second mixed layer 220d may gradually increase from a lower portion of the second mixed layer 220d to an upper portion of the second mixed layer 220d. A portion of the second mixed layer 220d that is closest to the third hole transport layer 220c may include the second material, a portion of the second mixed layer 220d that is closest to the second hole transport layer 220e may include the first material, and an amount of the first material may increase and an amount of the second material may decrease from the lower portion of the second mixed layer 220d to the upper portion of the second mixed layer 220d. In addition, the portion of the second mixed layer 220d that is closest to the second hole transport layer 220e may include the first material, and an amount of the first material may decrease and an amount of the second material may increase from the upper portion of the second mixed layer 220d to the lower portion of the second mixed layer 220d. In other words, the second mixed layer 220d includes the first material and the second material, and a content of the first material in the second mixed layer 220d may gradually increase from the lower portion of the second mixed layer 220d to the upper portion of the second mixed layer 220d, and a content of the second material may gradually decrease from the lower portion of the second mixed layer 220d to the upper portion of the second mixed layer 220d. In this case, the lower portion may refer to a portion adjacent to the first electrode 210 as compared to the upper portion.

In an embodiment, as the amount of the first material included in the second mixed layer 220d increases from the lower portion to the upper portion, and the amount of the second material decreases from the lower portion to the upper portion, the charges (e.g., holes) may be easily transmitted from the third hole transport layer 220c including the second material to the second hole transport layer 220e including the first material.

Thus, when the hole transport layer 220 includes the first hole transport layer 220a, the first mixed layer 220b, the third hole transport layer 220c, the second mixed layer 220d, the second hole transport layer 220e that are sequentially stacked, an absolute value of a difference between HOMO1 of the first material and HOMO2 of the second material is 0.3 eV or less, and the sum of the first standard deviation σ1 and the second standard deviation σ2 is 0.3 eV or more, the transport of charges (e.g., holes) may be smoothly performed between the first material and the second material, and thus, the charges (e.g., holes) may be easily transmitted from the first hole transport layer 220a to the second hole transport layer 220e.

In an embodiment, when the hole transport layer 220 is formed by using a first material and a second material different from the first material, the hole transport layer 220 may include a first hole transport layer 220a, a first mixed layer 220b, a third hole transport layer 220c, a second mixed layer 220d, and a second hole transport layer 220e that are sequentially stacked. In this case, each of the first hole transport layer 220a and the second hole transport layer 220e may include the first material, the third hole transport layer 220c may include the second material, and each of the first mixed layer 220b and the second mixed layer 220d may include the first material and the second material.

Figure 8:
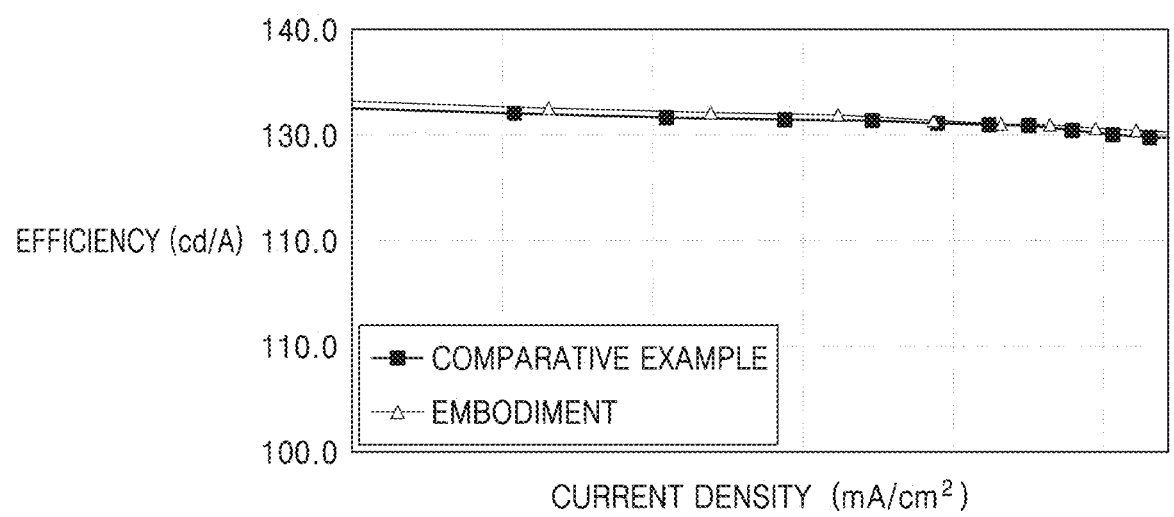
FIG. 8 is a graph illustrating an efficiency according to current densities of an Example and a Comparative Example.
Figure 9:
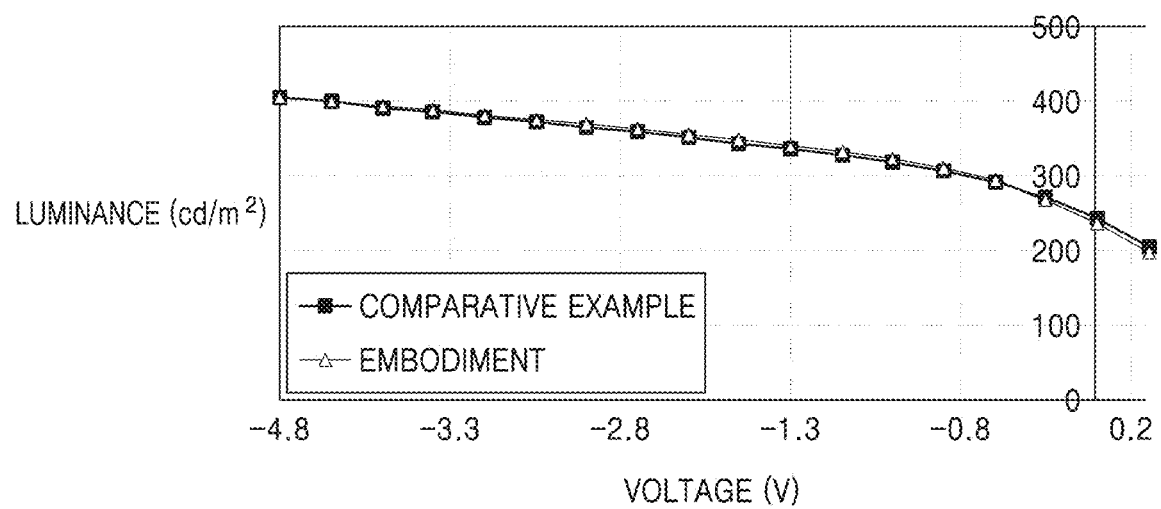
FIG. 9 is a graph illustrating luminance according to voltages of an Example and a Comparative Example.

FIG. 8 is a graph illustrating an efficiency according to a Density of States (DOS) of an Example and a Comparative Example, and FIG. 9 is a graph illustrating a luminance according to voltages of the Example and the Comparative Example.

In FIGS. 8 and 9, the Example corresponds to an organic light-emitting diode OLED including a hole transport layer 220 including a first hole transport layer 220a, a first mixed layer 220b, a third hole transport layer 220c, a second mixed layer 220d, and a second hole transport layer 220e that are sequentially stacked, and the Comparative Example corresponds to an organic light-emitting diode OLED including the hole transport layer 220 including a first material.

Referring to FIGS. 8 and 9, it may be understood that an efficiency graph according to a DOS of the Example and an efficiency graph according to a DOS of the Comparative Example have similar values (behaviors) to each other, and that a luminance graph according to voltages of the Example and a luminance graph according to voltages of the Comparative Example have similar values (behaviors) to each other.

Accordingly, it may be understood that the organic light-emitting diode OLED including the hole transport layer 220 formed by using the first material and the second material and the organic light-emitting diode OLED including the hole transport layer 220 formed by using the first material have similar characteristic values to each other. In this case, the second material may be cheaper than the first material.

Thus, when the hole transport layer 220 is formed by using the first material and the second material, the hole transport layer 220 may be formed at a lower cost while having a similar optical and electrical characteristics to a case where the hole transport layer 220 is formed by using only the first material, and thus, a manufacturing cost of the organic light-emitting diode OLED may be reduced. When the hole transport layer 220 is formed by using the first material and the second material, a use rate of the first material may be reduced by 50% or more as compared to a case where the hole transport layer 220 is formed by using only the first material, and accordingly, a cost of materials forming the hole transport layer 220 may be reduced by about 45% to about 70%, and thus, the manufacturing cost of the organic light-emitting diode OLED (e.g., a display apparatus) may be reduced.

Figure 10:
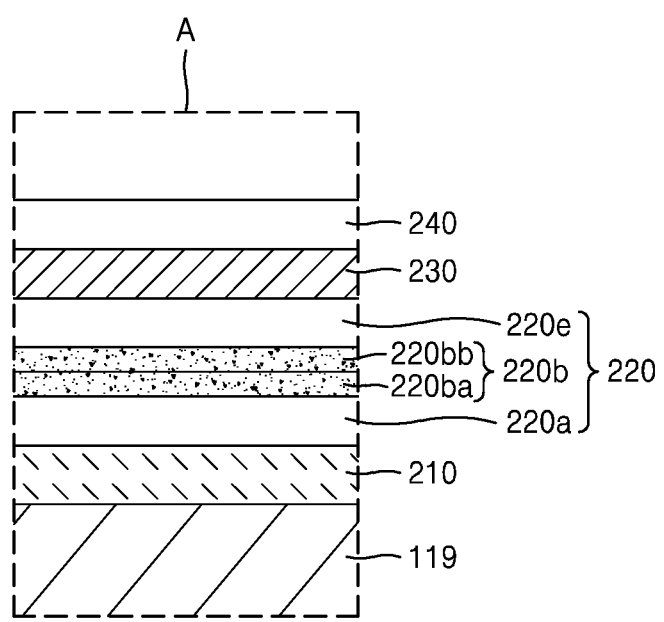
FIG. 10 is an enlarged view of region A in FIG. 5, according to an embodiment.

FIG. 10 is an enlarged view of region A in FIG. 5, according to an embodiment. The embodiment of FIG. 10 is different from the embodiment of FIG. 6 in that the hole transport layer 220 includes a first hole transport layer 220a, a first mixed layer 220b, and a second hole transport layer 220e. In FIG. 10, the same reference symbols as those of FIG. 6 denote the same, and redundant descriptions thereof will be omitted.

Referring to FIGS. 5, 6, and 10, the hole transport layer 220 may include the first hole transport layer 220a, the first mixed layer 220b, and the second hole transport layer 220e. In an embodiment, each of the first hole transport layer 220a and the second hole transport layer 220e may include a first material, and the first mixed layer 220b may include the first material and a second material. In this case, the first material and the second material may be different from each other. Accordingly, the first mixed layer 220b may be a mixed layer in which the first material and the second material, which are different from each other, are mixed. In some embodiments, the first mixed layer 220b may be a layer in which the first material and the second material are alternately arranged.

In an embodiment, the first mixed layer 220b may include a first portion 220ba and a second portion 220bb. The first mixed layer 220b is arranged between the first hole transport layer 220a and the second hole transport layer 220e, wherein the first portion 220ba of the first mixed layer 220b is a portion adjacent to the first hole transport layer 220a, and the second portion 220bb of the first mixed layer 220b is a portion adjacent to the second hole transport layer 220e.

In an embodiment, the first hole transport layer 220a and the first mixed layer 220b may contact each other. For example, the first hole transport layer 220a and the first portion 220ba of the first mixed layer 220b may contact each other.

In an embodiment, the first mixed layer 220b includes the first material and the second material, wherein an amount of the first material in the first portion 220ba of the first mixed layer 220b may gradually decrease from a lower portion of the first portion 220ba to an upper portion of the first portion 220ba. A portion of the first portion 220ba of the first mixed layer 220b that is closest to the first hole transport layer 220a may include the first material, and an amount of the first material may decrease and an amount of the second material may increase from the lower portion of the first portion 220ba to the upper portion of the first portion 220ba. In other words, the first portion 220ba of the first mixed layer 220b may include the first material and the second material, wherein a content of the first material in the first portion 220ba of the first mixed layer 220b may gradually decrease from the lower portion of the first portion 220ba to the upper portion of the first portion 220ba of the first mixed layer 220b, and a content of the second material may gradually decrease from the lower portion of the first portion 220ba of the first mixed layer 220b to the upper portion of the first portion 220ba of the first mixed layer 220b. In this case, the lower portion may refer to a portion adjacent to the first electrode 210 as compared to the upper portion.

In such as configuration, an upper portion of the first hole transport layer 220a may directly contact the lower portion of the first portion 220ba.

In an embodiment, the second hole transport layer 220e and the first mixed layer 220b may contact each other. For example, the second hole transport layer 220e and the second portion 220bb of the first mixed layer 220b may contact each other.

In an embodiment, the first mixed layer 220b includes the first material and the second material, wherein an amount of the first material in the second portion 220bb of the first mixed layer 220b may gradually decrease from a lower portion of the second portion 220bb to an upper portion of the second portion 220bb. An interface between the second hole transport layer 220e and the second portion 220bb of the first mixed layer 220b may include the first material, and an amount of the first material may increase and an amount of the second material may decrease from the lower portion of the second portion 220bb to the upper portion of the second portion 220bb. The second portion 220bb of the first mixed layer 220b may include the first material and the second material, wherein a content of the first material in the second portion 220bb of the first mixed layer 220b may gradually increase from the lower portion of the second portion 220*bb* to the upper portion of the second portion 220*bb*, and a content of the second material may gradually decrease from the lower portion of the second portion 220*bb* to the upper portion of the second portion 220*bb*.

In such as configuration, an upper portion of the first portion 220*ba* may directly contact the second portion 220*bb*, and the second portion 220*bb* may directly contact the second hole transport layer 220*e*.

Because the first mixed layer 220*b* has the structure described above, charges (e.g., holes) may be easily transmitted from the first hole transport layer 220*a* to the second hole transport layer 220*e*.

Figure 11:
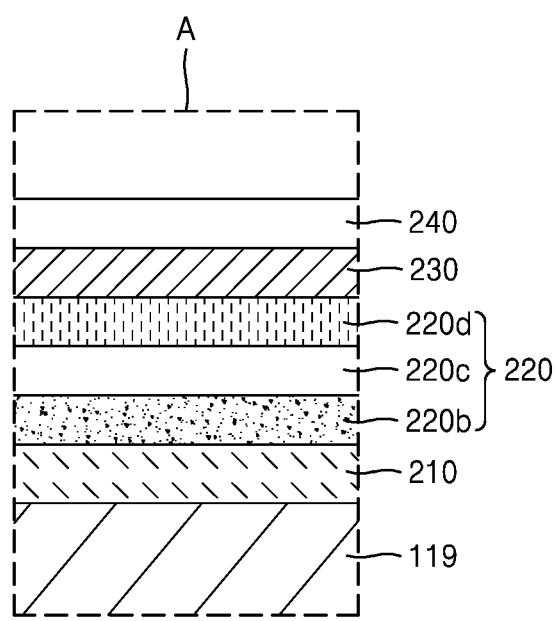
FIG. 11 is an enlarged view of region A in FIG. 5, according to an embodiment.

FIG. 11 is an enlarged view of region A in FIG. 5, according to an embodiment. The embodiment of FIG. 11 is different from the embodiment of FIG. 6 in that the hole transport layer 220 includes a first mixed layer 220*b*, a third hole transport layer 220*c*, and a second mixed layer 220*d*. In FIG. 11, the same reference symbols as those of FIG. 6 denote the same, and redundant descriptions thereof will be omitted.

Referring to FIGS. 5, 6, and 11, the hole transport layer 220 may include the first mixed layer 220*b*, the third hole transport layer 220*c*, and the second mixed layer 220*d*. In an embodiment, the third hole transport layer 220*c* may include a second material, and each of the first mixed layer 220*b* and the second mixed layer 220*d* may include a first material and the second material. In this case, the first material and the second material may be different from each other. Accordingly, each of the first mixed layer 220*b* and the second mixed layer 220*d* may be a layer in which the first material and the second material, which are different from each other, are mixed. In some embodiments, each of the first mixed layer 220*b* and the second mixed layer 220*d* may be a layer in which the first material and the second material, which are different from each other, are alternately arranged.

In an embodiment, the first mixed layer 220*b* and the third hole transport layer 220*c* may directly contact each other, and the third hole transport layer 220*c* and the second mixed layer 220*d* may directly contact each other. For example, the third hole transport layer 220*c* including the second material may be directly arranged on the first mixed layer 220*b* including the first material and the second material, and the second mixed layer 220*d* including the first material and the second material may be directly arranged on the third hole transport layer 220*c*.

In an embodiment, the first mixed layer 220*b* may include the first material and the second material, wherein an amount of the first material in the first mixed layer 220*b* may gradually decrease from a lower portion of the first mixed layer 220*b* to an upper portion of the first mixed layer 220*b*. A portion of the first mixed layer 220*b* that is closest to the first electrode 210 may include the first material, and an amount of the first material may decrease and an amount of the second material may increase from the lower portion of the first mixed layer 220*b* to the upper portion of the first mixed layer 220*b*. In addition, a portion of the first mixed layer 220*b* that is closest to the third hole transport layer 220*c* may include the second material, and an amount of the first material may increase and an amount of the second material may decrease from the upper portion of the first mixed layer 220*b* to the lower portion of the first mixed layer 220*b*. In other words, the first mixed layer 220*b* includes the first material and the second material, wherein a content of the first material in the first mixed layer 220*b* may gradually decrease from the lower portion of the first mixed layer 220*b* to the upper portion of the first mixed layer 220*b*, and a content of the second material may gradually increase from the lower portion of the first mixed layer 220*b* to the upper portion of the first mixed layer 220*b*. In this case, the lower portion may refer to a portion adjacent to the first electrode 210 as compared to the upper portion.

In an embodiment, as the amount of the first material included in the first mixed layer 220*b* decreases from the lower portion to the upper portion, and the amount of the second material included in the first mixed layer 220*b* increases from the lower portion to the upper portion, the charges (e.g., holes) may be easily transmitted from the first mixed layer 220*b* to the third hole transport layer 220*c* including the second material.

In an embodiment, the second mixed layer 220*d* may include the first material and the second material, wherein an amount of the first material in the second mixed layer 220*d* may gradually decrease from a lower portion of the second mixed layer 220*d* to an upper portion of the second mixed layer 220*d*. A portion of the second mixed layer 220*d* that is closest to the third hole transport layer 220*c* may include the second material, a portion of the second mixed layer 220*d* that is closest to the second electrode 240 may include the first material, and an amount of the first material may increase and an amount of the second material may decrease from the lower portion of the second mixed layer 220*d* to the upper portion of the second mixed layer 220*d*. In addition, the portion of the second mixed layer 220*d* that is closest to the second electrode 240 may include the first material, and an amount of the first material may decrease and an amount of the second material may increase from the upper portion of the second mixed layer 220*d* to the lower portion of the second mixed layer 220*d*. In other words, the second mixed layer 220*d* includes the first material and the second material, and a content of the first material in the second mixed layer 220*d* may gradually increase from the lower portion of the second mixed layer 220*d* to the upper portion of the second mixed layer 220*d*, and a content of the second material may gradually decrease from the lower portion of the second mixed layer 220*d* to the upper portion of the second mixed layer 220*d*. In this case, the lower portion may refer to a portion adjacent to the first electrode 210 as compared to the upper portion.

In an embodiment, as the amount of the first material included in the second mixed layer 220*d* increases from the lower portion to the upper portion, and the amount of the second material decreases from the lower portion to the upper portion, the charges (e.g., holes) may be easily transmitted from the third hole transport layer 220*c* including the second material to the second mixed layer 220*d*.

Referring back to FIG. 5, the emission layer 230 may be arranged on the hole transport layer 220. The emission layer 230 may include a polymer organic material or a low-molecular-weight organic material and may emit one of red light, green light, blue light, and white light. The second electrode 240 may be arranged on the emission layer 230. The second electrode 240 may include a conductive material having a low work function. For example, the second electrode 240 may include a (semi-)transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or any alloys thereof. In some embodiments, the second electrode 240 may further include a layer including ITO, IZO, ZnO, or $In_2O_3$, on the (semi-)transparent layer including the above material.

In an embodiment, a hole injection layer may be arranged between the first electrode 210 and the hole transport layer 220, and an electron transport layer and/or an electron injection layer may be arranged between the emission layer 230 and the second electrode 240.

Figure 12:
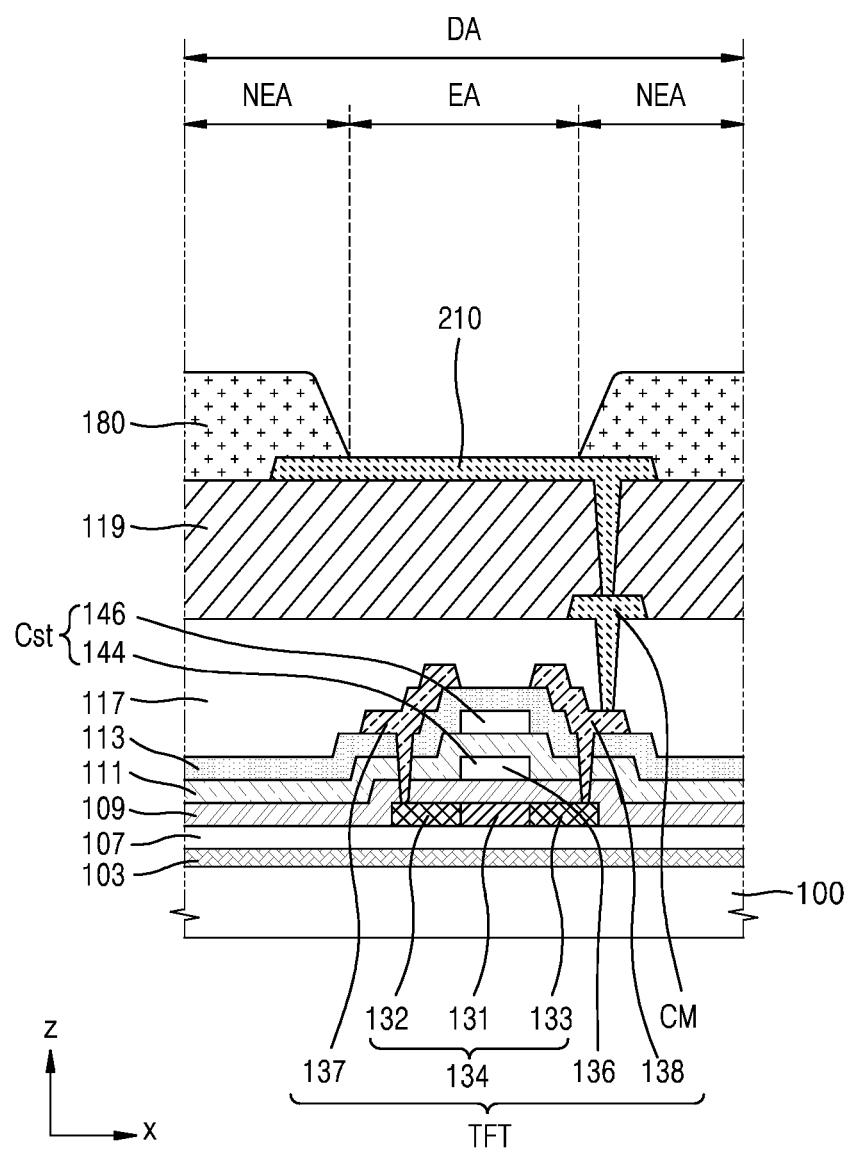
FIGS. 12 and 13 are cross-sectional views schematically illustrating a method of manufacturing a display apparatus, according to an embodiment.
Figure 13:
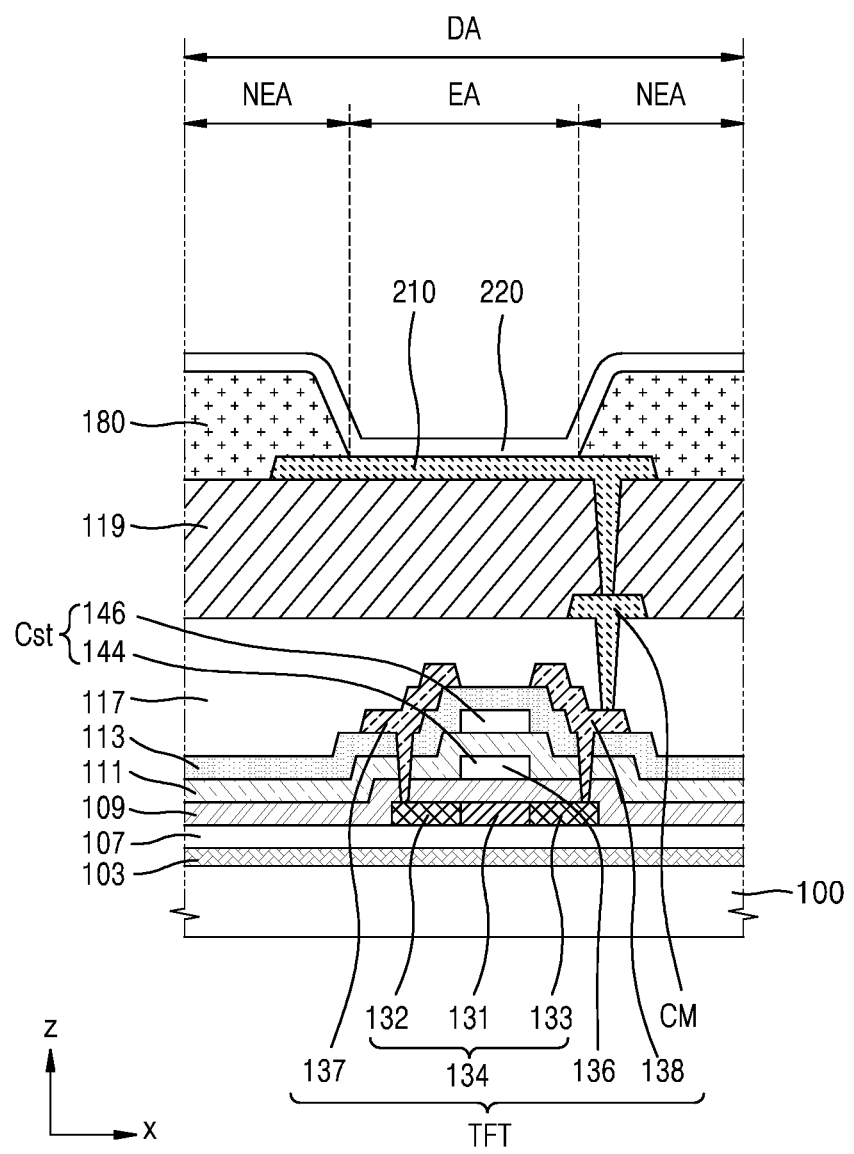

FIGS. 12 and 13 are cross-sectional views schematically illustrating a method of manufacturing a display apparatus, according to an embodiment.

Hereinafter, the method of manufacturing the display apparatus will be described with reference to FIGS. 12 and 13.

Referring to FIGS. 12 and 13, the method of manufacturing the display apparatus may include forming a first electrode 210 above a substrate 100, and forming a hole transport layer 220 on the first electrode 210.

In the forming of the first electrode 210 above the substrate 100, first, a barrier layer 103 and a buffer layer 107 may be formed on the substrate 100 including a glass material, a ceramic material, a metal material, or a material that is flexible or bendable. Each of the barrier layer 103 and the buffer layer 107 may include an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide (ZnO).

Thereafter, a thin-film transistor TFT and a storage capacitor Cst may be formed on the buffer layer 107. The thin-film transistor TFT may include a semiconductor layer 134, a gate electrode 136 overlapping the semiconductor layer 134, and a connection electrode electrically connected to the semiconductor layer 134. The storage capacitor Cst may include a lower electrode 144 and an upper electrode 146.

The semiconductor layer 134 may be formed on the buffer layer 107. The semiconductor layer 134 may include a channel area 131, a source area 132, and a drain area 133, wherein the channel area 131 overlaps the gate electrode 136, and the source area 132 and the drain area 133 are respectively arranged at opposite sides of the channel area 131, and include impurities of higher concentration than the channel area 131.

A first insulating layer 109 may be formed on the semiconductor layer 134, the gate electrode 136 may be formed on the first insulating layer 109, and a second insulating layer 111 may be formed on the gate electrode 136.

The storage capacitor Cst may be formed above the first insulating layer 109. The storage capacitor Cst may include the lower electrode 144 and the upper electrode 146 overlapping the lower electrode 144. The lower electrode 144 and the upper electrode 146 of the storage capacitor Cst may overlap each other with the second insulating layer 111 therebetween.

The upper electrode 146 may be formed on the second insulating layer 111, a third insulating layer 113 may be formed on the upper electrode 146, and a source electrode 137 and a drain electrode 138, which are connection electrodes, may be formed on the third insulating layer 113.

A first planarization layer 117 may be formed on the source electrode 137 and the drain electrode 138, a contact metal layer CM may be formed on the first planarization layer 117, and a second planarization layer 119 may be formed on the contact metal layer CM.

The first electrode 210 and a pixel-defining layer 180 may be formed on the second planarization layer 119. The pixel-defining layer 180 may have an opening through which at least a portion of the first electrode 210 is exposed.

Thereafter, the forming of the hole transport layer 220 on the first electrode 210 may be performed. In an embodiment, the hole transport layer 220 may be formed by spraying a first material and a second material onto the first electrode 210.

Figure 14:
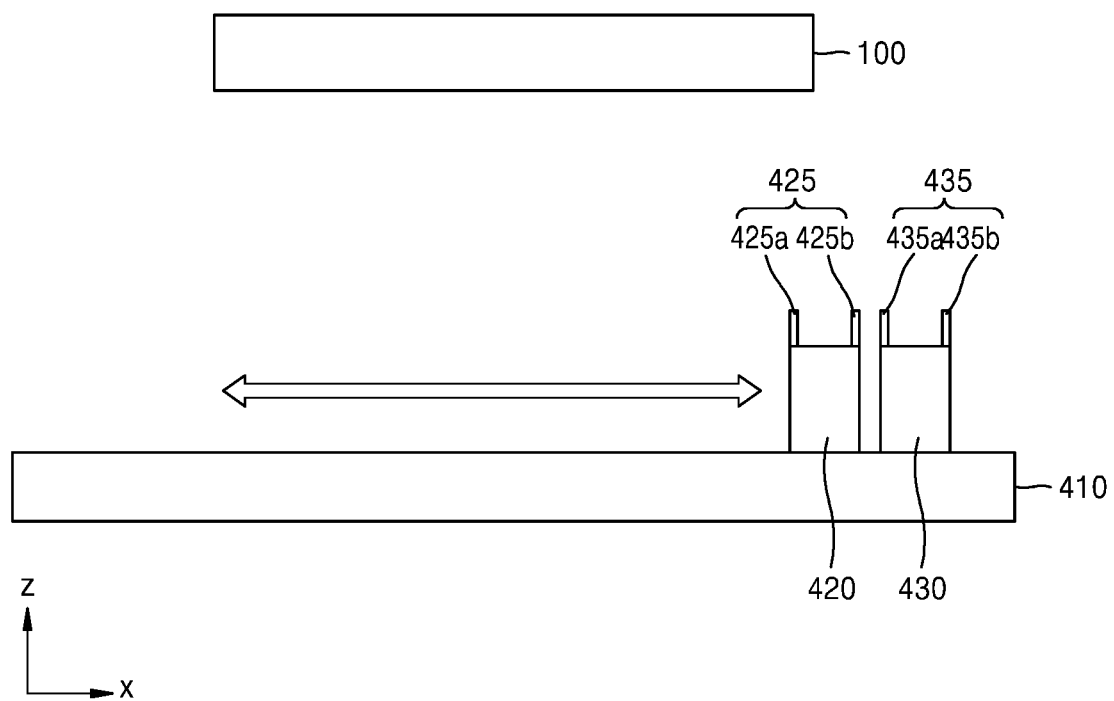
FIG. 14 is a diagram briefly illustrating a method of manufacturing a display apparatus, according to an embodiment.

FIG. 14 is a diagram briefly illustrating a method of manufacturing a display apparatus, according to an embodiment. FIG. 14 is a diagram illustrating a process of forming a hole transport layer 220 on the first electrode 210, and elements illustrated in FIG. 12 may be arranged on a substrate 100 of FIG. 14. For example, the elements illustrated in FIG. 12 may be arranged to face a first depositing source 420 and a second depositing source 430. However, in FIG. 14, the elements arranged on the substrate 100 are omitted for convenience of description and illustration.

Referring to FIG. 14, in the forming of the hole transport layer 220 on the substrate 100 (e.g., the first electrode 210), a first material may be sprayed onto the substrate 100 (e.g., the first electrode 210) by using the first depositing source 420, and a second material, which is different from the first material, may be sprayed onto the substrate 100 (e.g., the first electrode 210) by using the second depositing source 430.

In an embodiment, the first depositing source 420 and the second depositing source 430 may respectively spray the first material and the second material onto an entire deposition area of the substrate 100 (e.g., the first electrode 210) while reciprocating (moving back and forth) in a chamber along a rail 410 in a first direction (an x direction). In FIG. 4, one first depositing source 420 and one second depositing source are illustrated, but the number of first depositing sources and the number of second depositing sources are not limited thereto. Although not illustrated, each of the first depositing source 420 and the second depositing source 430 may be provided in two or three.

For example, the first depositing source 420 and the second depositing source 430 may respectively spray the first material and the second material onto the substrate 100 (e.g., the first electrode 210) while moving in the first direction (the x direction). Further, the first depositing source 420 and the second depositing source 430 may respectively spray the first material and the second material onto the substrate 100 (e.g., the first electrode 210) while returning to their original positions. Thus, the first depositing source 420 and the second depositing source 430 may spray the first material and the second material, respectively, onto the substrate (e.g., the first electrode 210) while reciprocating (moving back and forth) in the first direction (the x direction), and accordingly, the hole transport layer 220 may be formed.

In an embodiment, a deposition may also be performed as the substrate 100 reciprocates or rotates while the first deposition source 420 and the second deposition source 430 are in a fixed state.

Figure 15:
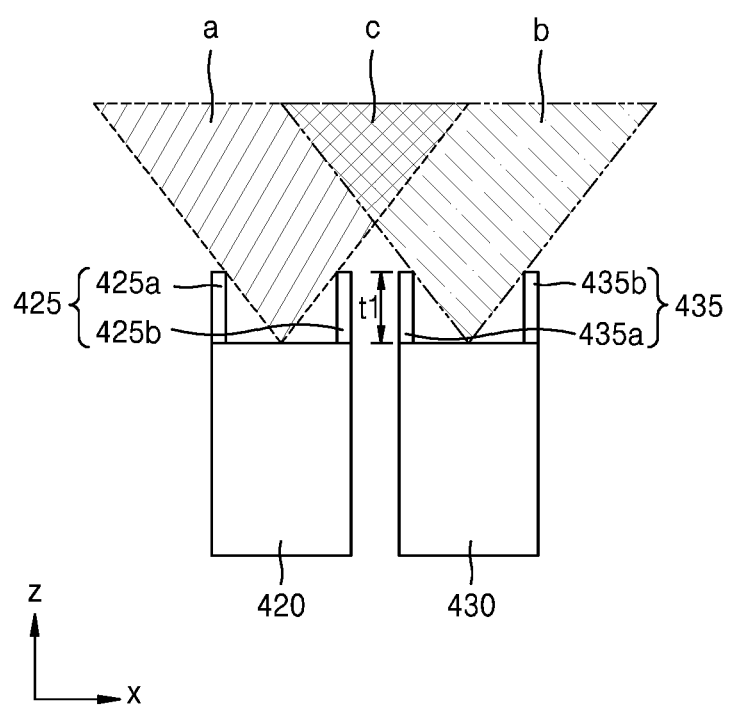
FIGS. 15 and 16 are diagrams illustrating a process of depositing a hole transport layer of a display apparatus, according to an embodiment.
Figure 16:
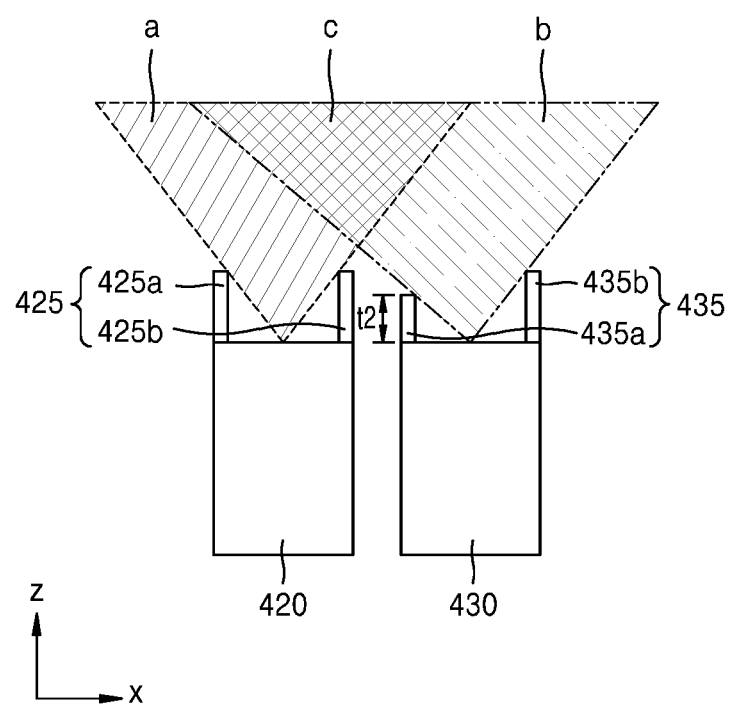

FIGS. 15 and 16 are cross-sectional views illustrating a process of depositing a hole transport layer of a display apparatus, according to an embodiment.

Referring to FIG. 15, a first depositing source 420 may spray a first material onto the substrate 100 (e.g., the first electrode 210), and a second depositing source 430 may spray a second material different from the first material onto the substrate 100 (e.g., the first electrode 210).

In an embodiment, the first depositing source 420 and the second depositing source 430 may include restricting plates 425 and 435, respectively. For example, the first depositing source 420 may include a first restricting plate 425a and a second restricting plate 425b, and the second depositing source 430 may include a third restricting plate 435a and a fourth restricting plate 435b.

In an embodiment, the first material may be sprayed from the first depositing source 420 to a portion "a," and the second material may be sprayed from the second depositing source 430 to a portion "b." In this case, a portion "c" where the portion "a" onto which the first material is sprayed from the first depositing source 420 and the portion "b" onto which the second material is sprayed from the second depositing source 430 overlap each other may be formed.

Hereinafter, a hole transport layer 220 including the first hole transport layer 220a, the first mixed layer 220b, the third hole transport layer 220c, the second mixed layer 220d, and the second hole transport layer 220e of FIG. 6 will be described as an example.

First, the first material and the second material are sprayed from the first depositing source 420 and the second depositing source 430, respectively, wherein the first hole transport layer 220a may be formed by the first material that is sprayed onto a part of the portion "a" excluding a part of the portion "a" overlapping the portion "c". Accordingly, the first hole transport layer 220a may include the first material. In this case, a deposition is performed while the first depositing source 420 and the second depositing source 430 move in the first direction (the x direction), and thus, the first hole transport layer 220a may be formed over the entire substrate 100 (e.g., the first electrode 210).

Thereafter, the first mixed layer 220b may be formed on the first hole transport layer 220a by the first material and the second material, which are sprayed onto the portion "c" where the portion "a" onto which the first material is sprayed from the first depositing source 420 and the portion "b" onto which the second material is sprayed from the second depositing source 430 overlap each other. Thus, the first mixed layer 220b may be a layer in which the first material and the second material are mixed, and the first mixed layer 220b may be directly formed on the first hole transport layer 220a. In this case, because a deposition is performed as the first depositing source 420 and the second depositing source 430 move in the first direction (the x direction), the first mixed layer 220b in which the first material and the second material are mixed may be formed over the entire first hole transport layer 220a, wherein an amount of the first material in the first mixed layer 220b may gradually decrease from the lower portion of the first mixed layer 220b to the upper portion of the first mixed layer 220b, and an amount of the second material in the first mixed layer 220b may gradually increase from the lower portion of the first mixed layer 220b to the upper portion of the first mixed layer 220b. In this case, the lower portion may refer to a portion adjacent to the first electrode 210 as compared to the upper portion.

Thereafter, the second material sprayed onto the portion "c" excluding a part thereof overlapping with the portion "b" may form the third hole transport layer 220c on the first mixed layer 220b. Accordingly, the third hole transport layer 220c may include the second material. In this case, a deposition is performed while the first depositing source 420 and the second depositing source 430 move in the first direction (the x direction), and thus, the third hole transport layer 220c may be formed over the entire first mixed layer 220b.

In addition, the first depositing source 420 and the second depositing source 430 may respectively spray the first material and the second material onto the substrate 100 (e.g., the first electrode 210) while returning to their original positions, and thus, the second mixed layer 220d may be formed on the third hole transport layer 220c, and the second hole transport layer 220e may be formed on the second mixed layer 220d. The second mixed layer 220d may be a layer in which the first material and the second material are mixed, and the second hole transport layer 220e may be a layer including the first material.

Through the process described above, the hole transport layer 220 including the first hole transport layer 220a, the first mixed layer 220b, the third hole transport layer 220c, the second mixed layer 220d, and the second hole transport layer 220e may be formed on the substrate 100 (e.g., the first electrode 210).

In an embodiment, the hole transport layer 220 including the first hole transport layer 220a, the first mixed layer 220b, the third hole transport layer 220c, the second mixed layer 220d, and the second hole transport layer 220e may be formed on the substrate 100 (e.g., the first electrode 210) through one reciprocating motion of the depositing sources 420 and 430.

In an embodiment, an area in which the first material and/or the second material are/is deposited may be controlled by adjusting an angle (or height) of the restricting plates 425 and 435 respectively included in the first and second depositing sources 420 and 430.

For example, as illustrated in FIG. 16, when a height of the third restricting plate 435a included in the second depositing source 430 is lowered from a first height t1 (see FIG. 15) to a second height t2, the second material is sprayed from the second depositing source 430 to a larger portion (area), and the portion "c" where the portion a onto which the first material is sprayed and the portion "b" onto which the second material is sprayed overlap each other is increased, and thereby, a thickness of the first mixed layer 220b and/or the second mixed layer 220d may increase.

In an embodiment, when the portion "a" onto which the first material is sprayed completely overlaps the portion "c" where the portion "a" onto which the first material is sprayed overlaps the portion "b" to which the second material is sprayed, and the portion "b" has a part that does not overlap the portion "c," the hole transport layer 220 in which the first mixed layer 220b, the third hole transport layer 220c, and the second mixed layer 220d are sequentially formed as illustrated in FIG. 11 may be formed. In this case, the first mixed layer 220b and the second mixed layer 220d may be layers in which the first material and the second material are mixed, and the third hole transport layer 220c may be a layer including the second material.

In addition, the hole transport layer 220 having a structure as described above may be formed by adjusting an angle (or height) of the first restricting plate 425a of the first depositing source 420.

In an embodiment, by adjusting an angle (or height) of the second restricting plate 425b of the first depositing source 420 or by adjusting an angle (or height) of the fourth restricting plate 435b of the second depositing source 430, the hole transport layer 220 in which the first hole transport layer 220a, the first mixed layer 220b, and the second hole transport layer 220e as illustrated in FIG. 10 are sequentially formed may be formed. In this case, the first mixed layer 220b may be a layer in which the first material and the second material are mixed with each other, and the first hole transport layer 220a and the second hole transport layer 220e may be layers including the first material.

Thereafter, although not illustrated, forming of the emission layer 230 (see FIG. 5) on the hole transport layer 220, and forming of the second electrode 240 (see FIG. 5) on the emission layer 230 (see FIG. 5) may be further performed.

According to an embodiment configured as described above, by using materials of different types, a display apparatus of which a manufacturing cost may be reduced while maintaining the characteristics of the display apparatus, and a method of manufacturing the display apparatus may be implemented. The scope of the present disclosure is not limited to the above effects.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
a substrate;
a first electrode on the substrate;
a second electrode on the first electrode;
an emission layer disposed between the first electrode and the second electrode; and
a hole transport layer located between the first electrode and the emission layer, and including a first mixed layer in which a first material and a second material different from the first material are combined with each other,
wherein an absolute value of a difference between a Highest Occupied Molecular Orbital (HOMO) energy level of the first material and a HOMO energy level of the second material is about 0.3 eV or less, and
wherein the hole transport layer further comprises:
a first hole transport layer located between the first electrode and the first mixed layer and including the first material, and a second hole transport layer located between the first mixed layer and the second electrode and including the first material.

2. The display apparatus of claim 1, wherein a Density of States (DOS) of the first material and a DOS of the second material at least partially overlap each other.

3. The display apparatus of claim 2, wherein a sum of a standard deviation of the DOS of the first material and a standard deviation of the DOS of the second material is about 0.3 eV or more.

4. The display apparatus of claim 3, wherein the first mixed layer comprises:
a first portion and a second portion, wherein an amount of the first material in the first portion gradually decreases from a lower portion of the first portion to an upper portion of the first portion, and an amount of the first material in the second portion gradually increases from a lower portion of the second portion to an upper portion of the second portion.

5. The display apparatus of claim 4, wherein the first portion and the first hole transport layer contact each other, and the second portion and the second hole transport layer contact each other.

6. The display apparatus of claim 3, wherein the hole transport layer further comprises:
a third hole transport layer located between a first mixed layer and the second hole transport layer and including the second material, and a second mixed layer between the third hole transport layer and the second hole transport layer, wherein, in the second mixed layer, the first material and the second material are mixed with each other.

7. The display apparatus of claim 6, wherein an amount of the first material in the first mixed layer gradually decreases from a lower portion of the first mixed layer to an upper portion of the first mixed layer.

8. The display apparatus of claim 7, wherein the first hole transport layer and the first mixed layer contact each other, and the first mixed layer and the third hole transport layer contact each other.

9. The display apparatus of claim 6, wherein an amount of the first material in the second mixed layer gradually increases from a lower portion of the second mixed layer to an upper portion of the second mixed layer.

10. The display apparatus of claim 8, wherein the second hole transport layer and the second mixed layer contact each other, and the second mixed layer and the third hole transport layer contact each other.

11. A display apparatus comprising:
a substrate;
a first electrode on the substrate;
a second electrode on the first electrode;
an emission layer disposed between the first electrode and the second electrode; and
a hole transport layer located between the first electrode and the emission layer, and including a first mixed layer in which a first material and a second material different from the first material are combined with each other,
wherein an absolute value of a difference between a Highest Occupied Molecular Orbital (HOMO) energy level of the first material and a HOMO energy level of the second material is about 0.3 eV or less,
wherein the hole transport layer further comprises:
a second mixed layer between the first mixed layer and the second electrode. and a first hole transport layer located between the second mixed layer and the second electrode and including the second material, and
wherein an amount of the first material in the first mixed layer gradually decreases from a lower portion of the first mixed layer to an upper portion of the first mixed layer.

12. The display apparatus of claim 11, wherein an amount of the first material in the second mixed layer gradually increases from a lower portion of the second mixed layer to an upper portion of the second mixed layer.

13. The display apparatus of claim 12, wherein the first mixed layer and the first hole transport layer contact each other, and the first hole transport layer and the second mixed layer contact each other.

* * * * *